United States Patent [19]

Kawahara et al.

[11] Patent Number: 4,839,300

[45] Date of Patent: Jun. 13, 1989

[54] METHOD OF MANUFACTURING SEMICONDUCTOR DEVICE HAVING TRAPEZOIDAL SHAPED SUBSTRATE SECTIONS

[75] Inventors: Yukito Kawahara; Hiroshi Mukainakano; Satoshi Machida, all of Tokyo, Japan

[73] Assignee: Seiko Instruments & Electronics Ltd., Tokyo, Japan

[21] Appl. No.: 937,532

[22] Filed: Dec. 3, 1986

[30] Foreign Application Priority Data

Dec. 20, 1985 [JP] Japan .................................. 287442

[51] Int. Cl.⁴ .......................................... H01L 21/463
[52] U.S. Cl. ...................................... 437/002; 437/227
[58] Field of Search ........................ 437/226, 227, 002; 83/34, 36

[56] References Cited

U.S. PATENT DOCUMENTS 3,078,559  2/1963  Thomas ............................... 437/226
4,138,304  2/1979  Gantley ................................. 83/14

FOREIGN PATENT DOCUMENTS 0029176  3/1980  Japan .................................. 437/226
0008141  2/1983  Japan .................................. 437/226
0131751  8/1983  Japan .................................. 437/227

Primary Examiner—Olik Chaudhuri
Attorney, Agent, or Firm—Bruce L. Adams; Van C. Wilks

[57] ABSTRACT

A method for manufacturing a semiconductor device using inclined stage of a dicing saw in order to cut the semiconductor substrate obliquely with respect to the depthwise direction. When a plurality of semiconductor chips diced obliquely are connected, a degree of connecting accuracy is increased, and it is possible to realize a contact-type image sensor of high resolving power and high accuracy.

7 Claims, 2 Drawing Sheets

METHOD OF MANUFACTURING SEMICONDUCTOR DEVICE HAVING TRAPEZOIDAL SHAPED SUBSTRATE SECTIONS

BACKGROUND OF THE INVENTION

The present invention relates to the configuration of a semiconductor chip having a circuit formed thereon. More particularly, the present invention pertains to a semiconductor device constituted by a plurality of semiconductor chips connected together with a high degree of accuracy.

1. Field of the Invention

There have heretofore been semiconductor devices adapted to receive the light reflected from a document irradiated with light and convert the received light into an electric signal. One type of such conventional semiconductor device is arranged such that a plurality of semiconductor chips are connected together to form a continuous or elongated line sensor having the same size as that of a particular document so as to read the document with a magnification of x1. The present invention provides an improvement in this type of semiconductor device wherein the configuration of a cross-section of each of a plurality of semiconductor chips connected together is specified which in cross-section has a ridge intersecting the connected end surfaces of a plurality of semiconductor chips and which is taken along the direction in which the semiconductor chips are arranged. More specifically, the above-described cross-section has the shape of a trapezoid having a long side defined by the side of the cross-section which is in turn defined by the obverse surface of the chip on which the circuit is formed, and a short side defined by the side of the cross-section which is in turn defined by the reverse surface of the chip. By virtue of this arrangement, a plurality of semiconductor chips can be connected together with a high degree of accuracy. In addition, if the present invention is applied to a semiconductor chip having a light-emitting element, it is also possible to realize a high-density light source for a contact-type LED printer.

2. Description of the Prior Art

Recently, various kinds of contact-type image sensors used as small-sized image input devices for business machines, computers, etc. have actively been developed. Contact-type image sensors need to be a continuous or elongated line sensor which has the same size as that of a particular document for the purpose of reading the document at a magnification of x1. To this end, there is a trend to make efforts to realize an elongated contact-type image sensor by connecting a plurality of silicon IC chips for which the process technique has already been established and which are excellent in reliability.

In this case, the error in connection between each pair of adjacent IC chips limits the resolving power of the contact-type image sensor when reading. To realize a high-resolving power contact-type image sensor, the condition of the end surfaces (diced surfaces) of each IC chip is a very important factor. In addition, since the higher the resolving power, the smaller the distance between each pair of adjacent sensors, it is necessary to precisely maintain the distance between the sensors respectively located on both sides of each joint.

A typical conventional method of cutting an IC chip will be explained below with reference to the accompanying drawings.

FIG. 2 shows a conventional cutting method. As shown in FIG. 2(A), a semiconductor substrate 1 is cut on the obverse side using a dicing saw in such a manner that the reverse side of the substrate 1 is left uncut with a thickness of several tens to several hundreds of microns. Then, a pressure is applied to the substrate 1 to break the same so as to be divided into chips. With this method, however, the end surface of an uncut portion cannot be made uniform due to, for example, the crystalline properties of the substrate and the way in which the pressure is applied to the substrate. This is shown by the non-uniform crack lines in FIG. 2(b). FIG. 2(C) shows a plurality of chips cut by the conventional method and connected together. The reference symbols $t_1$, $t_2$ and $t_3$ shown in FIG. 2(C) respectively represent chip connection errors. As illustrated, the chip spacings are not uniform, and there are large variations in the chip spacing. As a result, the sensor spacing between each pair of opposing connection surfaces becomes non-uniform, which means that it is impossible to obtain a contact-type image sensor of high resolving power and high accuracy.

There is another prior art method known as the through-cut method which has improved the above described conventional method. According to the through-cut method, a semiconductor substrate is cut to the reverse surface at a stretch in a dicing step without any portion of the substrate left uncut. This through-cut method will be explained below with reference to FIG. 2(D). The reference numeral 1 denotes a semiconductor substrate having circuits formed thereon, and the numeral 2 denotes an adhesive sheet. The adhesive sheet 2 is provided for the purpose of effecting full-cutting and of protecting the support stage of a dicing saw from being damaged. This method, however, still fails to completely eliminate uncut portions. FIG. 2(E) shows a cut surface of a semiconductor chip cut by the through-cut method. As a result of observation using a scanning electron microscope, it has been found that there are several chippings 10 of 5 μm in the shape of projections near the reverse surface and that few dust particles 11 regarded as silicon powder particles are attached to the side surface. FIG. 2(F) shows a plurality of such IC chips connected together. The chip connection errors $t_1$, $t_2$ and $t_3$ are reduced and uniformity is improved as compared with the conventional method shown in FIG. 2(C). However, the distance between each pair of adjacent chips is not satisfactorily small. In order to overcome these problems, still another dicing method has already been proposed. This prior art will be explained below with reference to FIGS. 2(G) and 2(H). In a first step, through-cutting is effected from the obverse surface of a semiconductor substrate 1 as shown in FIG. 2(G). After the completion of this step, the obverse surface is washed, dried, and an adhesive sheet 2 is stuck to the obverse surface, while the adhesive sheet 2 attached to the reverse surface is separated. In a second step, the substrate 1 is diced from the reverse surface using a blade 4 having a width somewhat wider than the blade 3, employed in the first step. This step is shown in FIG. 2(H). FIG. 2(I) shows a plurality of IC chips thus obtained and connected together. Thus, the uniformity of the gaps at the joints is improved, and the distance between each pair of adjacent IC chips is also reduced by a large margin, so that the degree of accuracy in connection is increased. This dicing method is, however, complicated as compared with the other conventional methods, and it is therefore difficult to improve the yield in the dicing step. In addition, it is impossible to eliminate the presence of dust particles 11 attached to the cut surfaces.

The above conventional method is disclosed in the following patent:

Japanese application Patent No. 12346/1984 applied Jan. 25, 1984.

SUMMARY OF THE INVENTION

As described above, to connect together semiconductor chips with a high degree of accuracy, a complicated dicing step must be carried out, and with a relatively simple conventional method the cross-sectional configuration of each of the cut semi-conductor chips cannot be uniformized, and the degree of accuracy in connection is also non-uniform. In addition, since the gap at each joint is unfavorably wide, it has heretofore been difficult to realize a contact-type image sensor of high resolving power and high accuracy at low costs.

An object of the present invention is to provide a method for manufacturing a semiconductor device, which is possible to improve the uniformity of the gap and reduce the gap dimension.

Another object of the present invention is to provide a semiconductor device which increases the degree of accuracy in arranging the semiconductor devices.

Another object of the present invention is to provide a contact-type image sensor which has high resolving power and high accuracy.

To realize the above objects, according to the present invention, the support of a dicing saw is inclined in order to cut a semiconductor substrate obliquely with respect to the depthwise direction thereof so that each of the cut surfaces of a chip extends obliquely toward the inside thereof.

A semicondcutor substrate is cut obliquely with respect to the depthwise direction thereof so that each of the cut surfaces of a chip at the joint extends obliquely toward the inside thereof from the obverse surface to the reverse surface, thereby reducing or eliminating the effects of chippings in the shape of projections produced near the reverse surface and of dust particles attached to the cut surfaces. Thus, when a plurality of semiconductor chips are connected, the degree of connecting accuracy is increased, and it is possible to realize a contact-type image sensor of high resolving power and high accuracy.

DETAILED DESCRIPTION OF THE PREFERRED EMBODIMENT

One embodiment of the present invention will be described hereinunder with reference to the accompanying drawings.

Figure 1A:
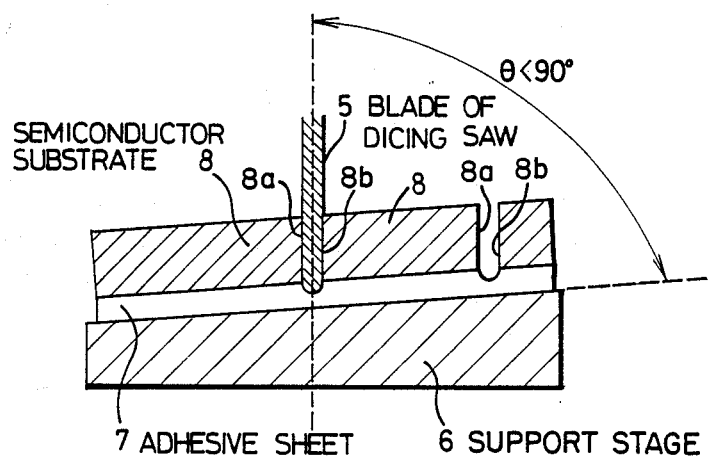
FIG. 1A to 1C are sectional views of a semiconductor device according to the present invention in the sequential steps of the manufacturing process.
Figure 1B:
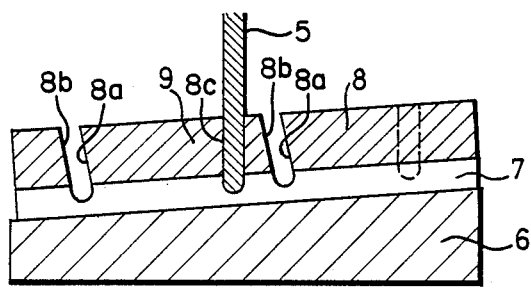
Figure 1C:
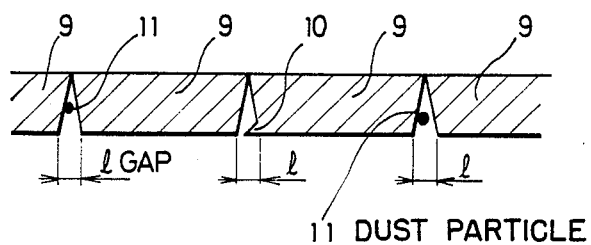
Figure 2:
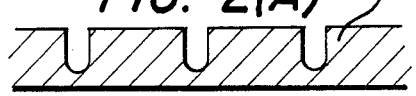
FIGS. 2(A) to 2(I) are sectional views of a semiconductor devices in the sequential steps of conventional manufacturing processes.
Figure 2:
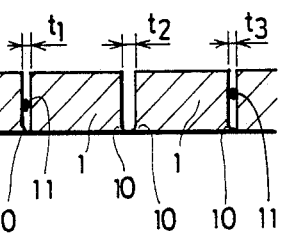
Figure 2:
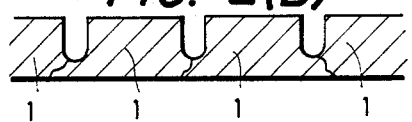
Figure 2:
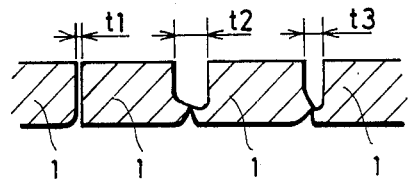
Figure 2:
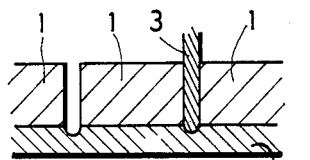
Figure 2:
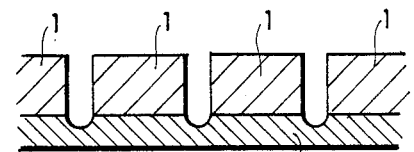
Figure 2:
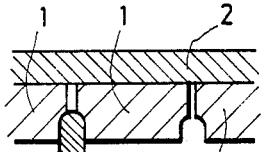
Figure 2:
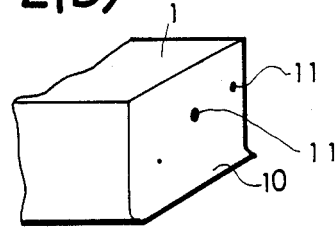
Figure 2:
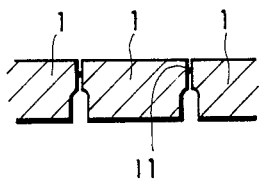

FIGS. 1A and 1B show in combination a cutting method to which the present invention is applied. As shown in FIG. 1A a semiconductor substrate 8 having an adhesive tape 7 stuck to the reverse surface thereof is a first suction-held on a surface of a support stage 6 which is set in such a manner that the angle $\theta$ made between the surface of the stage 6 and a blade 5 of a dicing saw is acute, and through-cutting is effected in this stage, thereby cutting one side of a desired semiconductor chip. Then, the semiconductor substrate 8 is turned 180° and suction-held on the stage 6 again, and the other side, opposing the cut side, is cut as shown in FIG. 1B. In this manner, the first cutting run (FIG. 1A) cuts the substrate 8 into plural substrate sections each having an acute-angled cut side 8a and an obtuse-angled cut side 8b, and the second cutting run (FIG. 1B) cuts off the obtuse-angled cut side 8b and forms another acute-angled cut side 8c so that the substrate sections have a generally trapazoidal cross section. FIG. 1C shows a plurality of semiconductor chips 9 thus cut and connected together. Thus, the uniformity of the gap at each chip joint is improved, and the gap dimension is reduced by a large margin, so that it is possible to increase the degree of connecting accuracy. It has been observed that most of the chippings 10 is the shape of projections produced near the reverse surface are of about 6 to 8 $\mu$m length, and most of the dust particles 11 attached to the cut side surfaces are of 5 $\mu$m or less. Therefore, in order to reduce or eliminate the effects of the projections 10 and particles 11, the gap at the lower side of the joint between semiconductor chips needs to be at least 10 $\mu$m. The angle $\theta$ (shown in FIG. 1A) made between the blade and the stage surface is determined using the thickness t of the wafer in accordance with the following formula:

$$\theta = arc.tan(2t/\lambda)$$

Accordingly, to cut a wafer of 300 $\mu$ thickness so that the gap $\lambda$ is 10 $\mu$, it is only necessary to set the angle between the blade and the stage surface such as to be 89°.

By connecting together a plurality of semiconductor chips having such configuration, it is possible to realize a contact-type image sensor of high resolving power.

It should be noted that, although in the above-described embodiment the surface of the support stage of the dicing saw is inclined, the blade may be inclined with the stage surface held horizontal as usual. This may be better than the first-mentioned arrangement in terms of operability. In the case where, with the angle between the blade and the stage fixed, one side is first cut and the other opposing side is then cut, it is possible to effect cutting simply by turning the stage through 180° while keeping the wafer suction-held on the support stage. It is therefore possible to eliminate the need for carrying out the step of removing the wafer from the support stage and suction holding the wafer on the stage again after the wafer has been turned 180°, as described with reference to FIG. 1. In addition, it is easy to obtain the required height of the tip of the blade with respect to the support stage surface. Thus, the blade may be inclined with the stage surface held horizontal as usual. Alternatively, both of them may be combined together. Depending on the angle of inclination, the object of the present invention can be attained even by half-cutting. This cutting method is also applicable to an LED array which constitutes a light source for a contact-type LED printer.

As will be clear from the description, when chips cut in accordance with the present invention are connected together, it is possible to improve the uniformity of the gap and reduce the gap dimension, which cannot be realized by the prior art. As a result, the degree of accuracy in arranging sensors on both sides of each junction is increased, and it is possible to realize a contact-type image sensor of high resolving power and high accuracy. In addition, the increase in the degree of connecting accuracy enables enlargement of the effective light-receiving area of the sensor in designing and permits the output to be increased advantageously. Further, the present invention is also applicable to a light-emitting element, and it is possible to realize a high-density LED array light source for an LED printer by a simple and easy dicing method.

What is claimed is:

1. A method for manufacturing a semiconductor device, comprising for the steps of: providing a semiconductor substrate having opposed major surfaces and having a plurality of spaced-apart circuits formed on one of the major surfaces; cutting the substrate obliquely in the depthwise direction thereof in the regions between adjacent circuits to separate the substrate into plural substrate sections each containing one circuit with each substrate section having one acute-angled cut side and one obtuse-angled cut side; cutting the substrate sections obliquely in the depthwise direction thereof to cut off the obtuse-angled cut sides to form substrate sections having crosssections of generally trapezoidal configuration; and connecting together the substrate sections in end-to-end relation so that the circuits on the substrate sections extend in a line to thereby form a semiconductor device.

2. A method according to claim 1; wherein the cutting steps are carried out by a dicing saw.

3. A method according to claim 2; wherein the cutting steps are carried out by cutting with the dicing saw at an oblique angle relative to the major surfaces of the substrate.

4. A method according to claim 1; wherein the circuits formed on one major surface of the semiconductor substrate include a light-receiving element, and the connected together substrate sections jointly comprise a line sensor semiconductor device.

5. A method according to claim 1; wherein the circuits formed on one major surface of the semiconductor substrate include a light-emitting element, and the connected together substrate sections jointly comprise a line light source semiconductor device.

6. A method according to claim 1; wherein the cutting steps comprise cutting the substrate into plural substrate sections while holding the substrate sections in a fixed positional relation relative to one another; and cutting the held-in-position substrate sections to form the substrate sections generally trapezoidal cross section.

7. A method according to claim 6; including holding the substrate sections in a fixed positional relation by adhering an adhesive sheet to one or both substrate major surface.

* * * * *